US008418046B2

(12) United States Patent
Yao et al.

(10) Patent No.: US 8,418,046 B2
(45) Date of Patent: Apr. 9, 2013

(54) DATA SIGNAL HANDLING CIRCUITRY AND METHODS WITH ERROR ANALYSIS CAPABILITIES

(75) Inventors: Wei Yao, Fremont, CA (US); Shawn Robert Gettemy, San Jose, CA (US); Barry Corlett, Brisbane, CA (US)

(73) Assignee: Apple Inc., Cupertino, CA (US)

( * ) Notice: Subject to any disclaimer, the term of this patent is extended or adjusted under 35 U.S.C. 154(b) by 389 days.

(21) Appl. No.: 12/229,685

(22) Filed: Aug. 25, 2008

(65) Prior Publication Data
US 2009/0204860 A1    Aug. 13, 2009

Related U.S. Application Data

(60) Provisional application No. 61/028,483, filed on Feb. 13, 2008.

(51) Int. Cl.
G06F 11/00 (2006.01)

(52) U.S. Cl. ........................................................ 714/817

(58) Field of Classification Search .................. 714/707, 714/708, 724, 726
See application file for complete search history.

(56) References Cited

U.S. PATENT DOCUMENTS

| | | | |
|---|---|---|---|
| 3,558,917 A | | 1/1971 | Crouse |
| 4,163,909 A * | | 8/1979 | Harr ................................. 327/59 |
| 5,223,784 A | | 6/1993 | Nelson et al. |
| 5,483,261 A | | 1/1996 | Yasutake |
| 5,488,204 A | | 1/1996 | Mead et al. |
| 5,491,706 A * | | 2/1996 | Tagawa et al. ................. 714/812 |
| 5,825,352 A | | 10/1998 | Bisset et al. |
| 5,835,079 A | | 11/1998 | Shieh |
| 5,880,411 A | | 3/1999 | Gillespie et al. |
| 6,057,910 A | | 5/2000 | Dunne |
| 6,188,391 B1 | | 2/2001 | Seely et al. |
| 6,310,610 B1 | | 10/2001 | Beaton et al. |
| 6,323,846 B1 | | 11/2001 | Westerman et al. |
| 6,587,800 B1 * | | 7/2003 | Parker et al. ..................... 702/79 |

(Continued)

FOREIGN PATENT DOCUMENTS

| | | |
|---|---|---|
| EP | 2 104 023 A2 | 9/2009 |
| JP | 2000-163031 A | 6/2000 |
| JP | 2002-342033 A | 11/2002 |
| WO | WO-2005/036510 A1 | 4/2005 |

OTHER PUBLICATIONS

Chong Zhao; Xiaoliang Bai; Sujit Dey; , "A static noise impact analysis methodology for evaluating transient error effects in digital VLSI circuits," Test Conference, 2005. Proceedings. ITC 2005. IEEE International , vol., No., pp. 10 pp. 1058, Nov. 8-8, 2005.*

(Continued)

*Primary Examiner* — Ajay Bhatia
*Assistant Examiner* — Daniel McMahon
(74) *Attorney, Agent, or Firm* — Fletcher Yoder PC

(57) ABSTRACT

Data receiver circuitry in the device is provided with one or more error signal output leads. An error signal on such a lead includes an error indication as soon as possible after the associated low level circuitry detects a data error. The timing of such an error indication is compared to the timing of noise from various possible noise sources in the device. The noise source that produced significant noise closest in time prior to the error indication is identified as the noise source responsible for the data error that caused the error indication.

21 Claims, 5 Drawing Sheets

U.S. PATENT DOCUMENTS

| | | | |
|---|---|---|---|
| 6,690,387 | B2 | 2/2004 | Zimmerman et al. |
| 7,015,894 | B2 | 3/2006 | Morohoshi |
| 7,024,337 | B2 * | 4/2006 | Yoda .......................... 702/183 |
| 7,072,804 | B2 | 7/2006 | Weller |
| 7,170,501 | B2 * | 1/2007 | Inamori ...................... 345/173 |
| 7,184,064 | B2 | 2/2007 | Zimmerman et al. |
| 7,367,004 | B2 * | 4/2008 | Katou .......................... 716/112 |
| 7,650,555 | B2 * | 1/2010 | Imming et al. ............... 714/738 |
| 7,663,607 | B2 | 2/2010 | Hotelling et al. |
| 2003/0058929 | A1 * | 3/2003 | Cox et al. .................... 375/150 |
| 2006/0026521 | A1 | 2/2006 | Hotelling et al. |
| 2006/0097991 | A1 | 5/2006 | Hotelling et al. |
| 2006/0197753 | A1 | 9/2006 | Hotelling |
| 2007/0046639 | A1 | 3/2007 | Swedin |
| 2008/0030239 | A1 * | 2/2008 | Sullivan et al. ................. 327/78 |
| 2008/0310485 | A1 * | 12/2008 | Soliman et al. ............... 375/147 |
| 2009/0202002 | A1 | 8/2009 | Yao et al. |
| 2010/0253641 | A1 | 10/2010 | Swedin |

OTHER PUBLICATIONS

K. Boyce, "An Introduction to the Mobile Industry Processor Interface (MIPI) Alliance Standard[;] Serial Low-Power Inter-Chip Media Bus (SLIMbus™)," National Semiconductor Audio Products Group, URL https://www.national.com/appinfo/audio/files/intro_to_SLIMbus.pdf, 20 pages, accessed on Oct. 2, 2008.

"SLIMbus™ Host Controller IP," Arasan Chip Systems, Inc., Version 1.4, 2008, URL http://www.arasan.com/products/prod_overview/mipi/SLIMbus-Host-pb.pdf, 2 pages, accessed on Oct. 2, 2008.

U.S. Appl. No. 12/240,697, filed Sep. 29, 2008.

U.S. Appl. No. 12/240,692, filed Sep. 29, 2008.

Lee, S.K. et al. (Apr. 1985). "A Multi-Touch Three Dimensional Touch-Sensitive Tablet," Proceedings of CHI: ACM Conference on Human Factors in Computing Systems, pp. 21-25.

Rubine, D.H. (Dec. 1991). "The Automatic Recognition of Gestures," CMU-CS-91-202, Submitted in Partial Fulfillment of the Requirements for the Degree of Doctor of Philosophy in Computer Science at Carnegie Mellon University, 285 pages.

Rubine, D.H. (May 1992). "Combining Gestures and Direct Manipulation," CHI '92, pp. 659-660.

Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

* cited by examiner

DATA SIGNAL HANDLING CIRCUITRY AND METHODS WITH ERROR ANALYSIS CAPABILITIES

This application claims the benefit of U.S. provisional patent application No. 61/028,483, filed Feb. 13, 2008, which is hereby incorporated by reference herein in its entirety.

BACKGROUND OF THE INVENTION

This invention relates to electronic circuitry, and more particularly to circuitry that processes digital signals that may be disturbed by noise (i.e., electrical interference) from other sources in the system that includes the digital signal handling circuitry.

An example of a system that includes digital signal handling circuitry and that may also include other sources of electrical interference is a hand-held device with an image display and other features such as cellular telephone capabilities. The iPhone® cellular telephone available from Apple Inc. of Cupertino, Calif., is one such system. For example, in a product of this kind, large amounts of data must be passed from processor circuitry of the device to driver circuitry for the image display (e.g., the liquid crystal display or LCD) of the device. The digital signals transmitting this data typically have high data rates and relatively low voltage swing. These characteristics render these signals subject to corruption (errors) due to, for example, electrical interference (noise) from other sources in the system. Data errors in such signals can cause errors in the images that appear on the display. Such display errors can be visible (even highly visible) to the user of the device. They can be distracting or annoying to the user, and they may even have other more serious effects or consequences. It is therefore desirable to find ways to reduce the occurrence of such errors.

Although the discussion herein may most frequently mention circuitry that is handling data signals for driving a display, it will be understood that this is only an example, and that the invention is equally applicable to circuitry that is handling data signals for other purposes.

SUMMARY OF THE INVENTION

In accordance with certain possible aspects of the invention, an electronic device includes a component that receives a data signal. This component processes data from the data signal through a series of circuit layers, beginning with a relatively low level circuit layer that initially receives the data signal, and ending with a relatively high level circuit layer that performs an application on data from the data signal. The relatively low level circuit layer outputs from the component an error signal containing an error indication substantially concurrent with the relatively low level circuit layer detecting an error in the data signal.

The electronic device may further include a lead conveying a noise signal containing noise indications substantially concurrent with noise produced by a noise source in the electronic device.

The electronic device may include processor circuitry for receiving the error signal and the noise signal, and for comparing timing of an error indication in the error signal and a noise indication in the noise signal. For example, if the error indication has a predetermined timing relationship to the noise indication, the processor may produce an output signal identifying the noise source as a possible cause of the error indication. An example of the above-mentioned predetermined timing relationship may be to require the noise indication to be no more than a predetermined amount of time prior to the error indication.

As an alternative or addition to the above, the device may have device output terminals to which the error signal and the noise signal are applied. Circuitry external to the electronic device may receive the error signal and the noise signal via these output terminals. The external circuitry may be adapted to display the error signal and the noise signal plotted against a common time base. Additionally or alternatively, the external circuitry may be adapted to compare timing of an error indication in the error signal and a noise indication in the noise signal.

Any or all of the above possible aspects of the invention may be extended to apply similarly to a plurality of noise signals, each of which contains noise indications substantially concurrent with noise produced by a respective one of a plurality of noise sources in the electronic device. The noise signal having a noise indication that is most closely correlated in time prior to an error indication may be used as a pointer to the noise source (associated with that noise signal) that may have caused the error indication.

The relatively low level circuit layer may be the physical layer of the data-signal-receiving circuitry of the component.

The component may comprise a display of the electronic device.

In accordance with other possible aspects, the invention may provide a method of testing an electronic device including a component that receives a data signal and that processes data from that signal through a series of circuit layers, beginning with a relatively low level circuit layer that initially receives the data signal, and ending with a relatively high level circuit layer that performs an application on data from the data signal. The method may include causing the relatively low level circuit layer to output from the component an error signal containing an error indication substantially concurrent with the relatively low level circuit layer detecting an error in the data signal. The method may further include comparing timing of the error indication in the error signal and a noise indication in a noise signal, the noise signal containing noise indications substantially concurrent with noise produced by a noise source in the electronic device.

The method may further include determining whether the noise indication is within a predetermined time interval prior to the error indication.

Any of the above method aspects may be extended to apply similarly to a plurality of noise signals, each of which contains noise indications substantially concurrent with noise produced by a respective one of a plurality of noise sources in the electronic device. In such a case, the invention may include determining whether the noise indication in any of the noise signals is within a predetermined time interval prior to the error indication, and if so, identifying the noise source for that noise signal as a possible cause of the error indication.

The above-mentioned "causing" may include outputting the error signal from physical layer circuitry of the component.

Further features of the invention, its nature and various advantages, will be more apparent from the accompanying drawings and the following detailed description.

DETAILED DESCRIPTION

Figure 1:
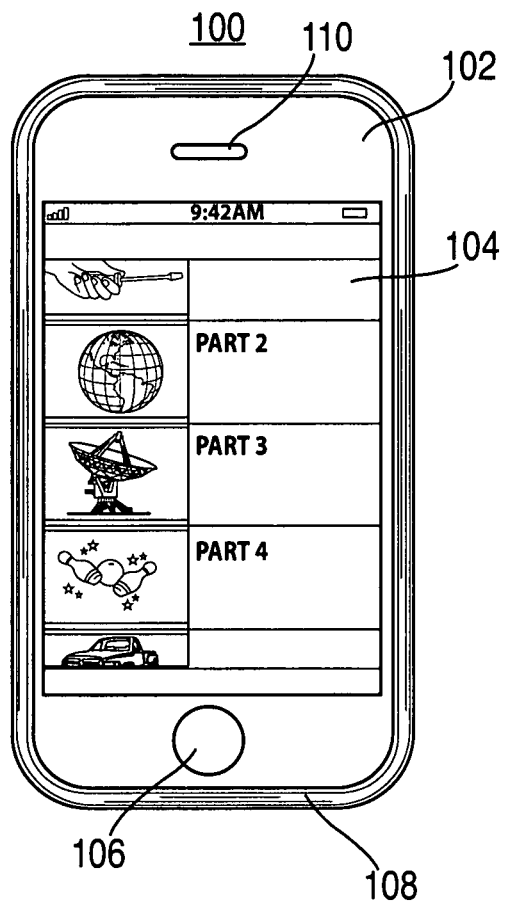
FIG. 1 is a simplified elevational view of an illustrative electronic device of the type that can benefit from the invention.

An illustrative electronic device 100 that can benefit from this invention is shown in FIG. 1. This device can be an Apple iPhone® cellular telephone; but it will be understood that this is only an example, and that the invention is equally applicable to other electronic devices.

Device 100 includes a component 102, which is both a display screen and a touch-sensitive input pad. For example, component 102 may include a transparent touch panel over visual display 104. (The particular image information shown on display 104 in FIG. 1 is only an example of the kind of changeable image information that display 104 may be used to display.) Another input button 106 may be included on the front face of the device. A microphone 108 may be included along a lower edge of the device, and audio output 110 may be included near the top edge of the device.

Figure 2:
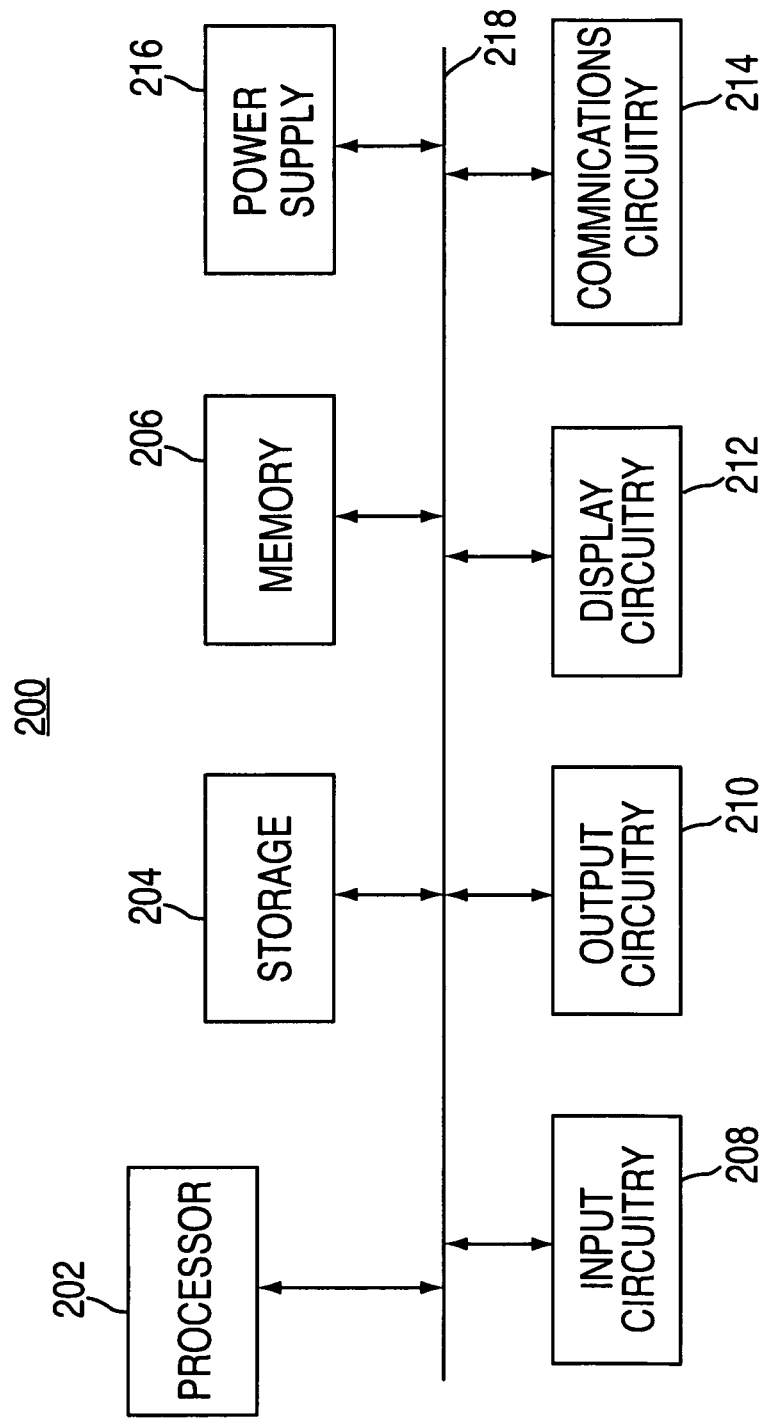
FIG. 2 is a simplified block diagram of an illustrative embodiment of circuitry that may be included in an electronic device of the type shown in FIG. 1.

Electronic circuitry 200 inside device 100 may have an overall organization like that shown in FIG. 2. Circuitry 200 may include processor circuitry 202, storage circuitry 204, memory circuitry 206, input circuitry 208 (e.g., supporting the touch panel of component 102 and microphone 108), output circuitry 210 (e.g., supporting audio output 110), display circuitry 212 (e.g., supporting display 104), communications circuitry 214 (e.g., supporting telecommunication with other remote devices), power supply circuitry 216, and interconnection circuitry 218 for conveying signals among the other components of circuitry 200.

Figure 3:
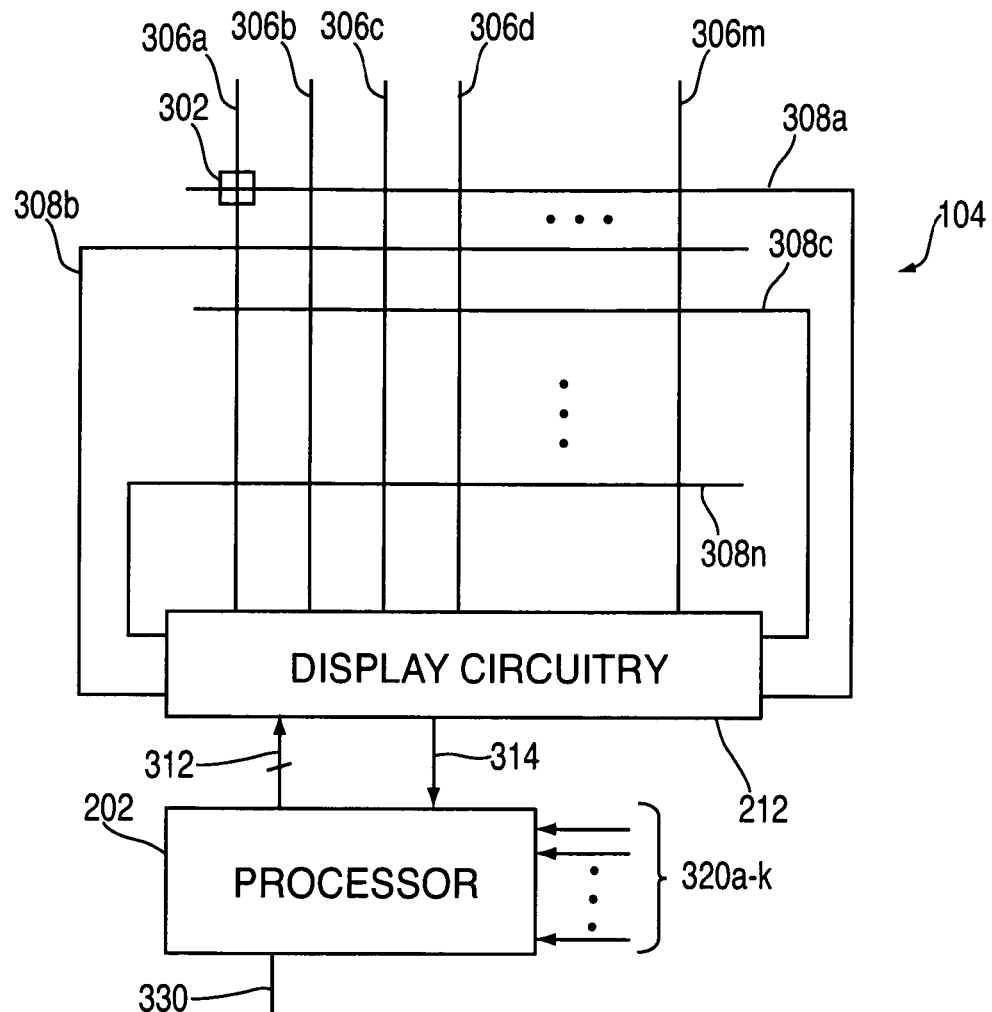
FIG. 3 is a simplified schematic block diagram of an illustrative embodiment of certain components from FIG. 2 in accordance with the invention.

FIG. 3 focuses somewhat more specifically on a portion of FIG. 2, with additional elements shown (including elements in accordance with the invention). In particular, FIG. 3 shows processor 202 applying data signals 312 to display circuitry 212. Display circuitry 212 controls the signals on a plurality of source lines 306a-m and a plurality of gate lines 308a-n. (Reference characters m and n are arbitrary index limit values.) The visual appearance of a pixel 302 at a source-line/gate-line intersection is controlled by the signals on those source and gate lines. (Only one representative pixel 302 is shown in FIG. 3 to avoid over-complicating the drawing.)

Figure 4:
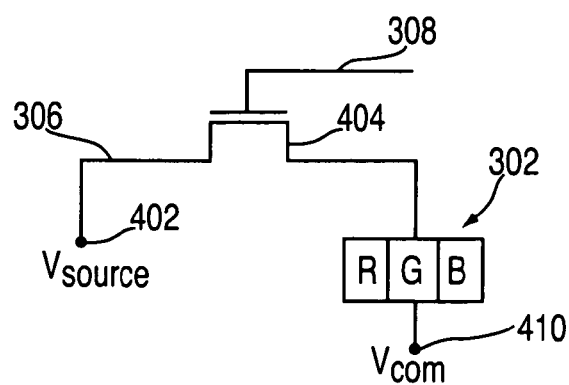
FIG. 4 is a simplified schematic block diagram of a representative portion of certain circuitry of the type shown in FIG. 3.

The circuitry associated with a typical pixel 302 is shown in more detail in FIG. 4. There it will be seen how a gate line signal 308 controls (via a transistor switch 404) application of a Vsource voltage to one electrode of pixel 302. The other electrode of pixel 302 is connected to a Vcommon (or Vcom) voltage. Pixel 302 includes red (R), green (G), and blue (B) display capability. Again, the visual appearance of pixel 302 is controlled by the voltage across its electrodes.

Returning to FIG. 3, and stating again what has already been said, data for controlling display 104 is applied to display circuitry 212 via leads 312. Display circuitry 212 typically includes several "layers" of circuitry performing a variety of tasks on the data signals received via leads 312. For example, it is typically necessary for circuitry 212 to (1) assemble successive bytes of data from these signals, (2) look for errors in the data, (3) correct any such errors to the extent possible, (4) process the data into the form suitable for controlling, display 104, and (5) actually use the processed data to drive the display (i.e., via source and gate lines 306 and 308).

The operations described in the preceding paragraph are typically complex operations involving large amounts of data that must be handled at very high data rates. To facilitate such data signalling and data handling operations, various industry-standard data communication protocols (e.g., the Mobile Pixel Link (MPL) protocol and the Mobile Industry Protocol Interface (MIPI) protocol) are known. Alternatively, a generally similar customized data communication protocol may be developed and employed. However, even with the benefit of all of this technology, the data signals 312 received by circuitry 212 can sometimes be corrupted by noise (electrical interference) from other sources in device 10 to a degree that is beyond the error-correction capability of circuitry 212. For example, the operation of a display component (e.g., the flow of power through the gate and/or source lines, as well as the charging of pixels) can result in noise that adversely impacts data. Thus display 104 itself may constitute a noise source in device 100. As another example, transmitting data from central processor 202 to display circuitry 212 without satisfying timing conditions for transmission may be another source of noise. Another source of noise may be a faulty connection between central processor 202 and display circuitry 212. Noise may also be created as a result of a user interaction with device 100. For example, if device 100 includes a touch screen, information transmitted from that screen to processor 202 may include noise. Typically contributing to sensitivity or susceptibility of signals 312 to noise are the relatively low power, low voltage swing, and high data rates of such signals. Whatever its source, such noise that causes uncorrectable data errors in signals 312 can result in errors in what the user sees on display 104, and this is very undesirable.

In accordance with the present invention, display circuitry 212 is equipped with an output lead 314 on which at least certain kinds of data errors detected by circuitry 212 are indicted (by an error indication in an error signal) as soon as possible after circuitry 212 has detected such a data error. Thus such an error indication is preferably output from component 212 (on lead 314) substantially concurrently with detection of a data error by data signal receiving and handling circuitry of component 212. In the embodiment shown in FIG. 3 error signal 314 is applied to processor 202. Also in this embodiment, processor 202 receives a plurality of other input signals 320a-k (where k is an arbitrary index limit value), each of which signals 320 may include a noise component from a respective noise source elsewhere in device 100. Examples of possible noise sources that may supply signals 320a-k have been identified earlier in this specification. To recapitulate just a few of these examples, one of signals 320 may indicate power supply noise of device 100. Another of signals 320 may indicate touch screen noise of device 100. Still another of signals 320 may indicate display noise of device 100. Others of signals 320 may indicate noise from other possible noise sources on device 100.

Figure 5:
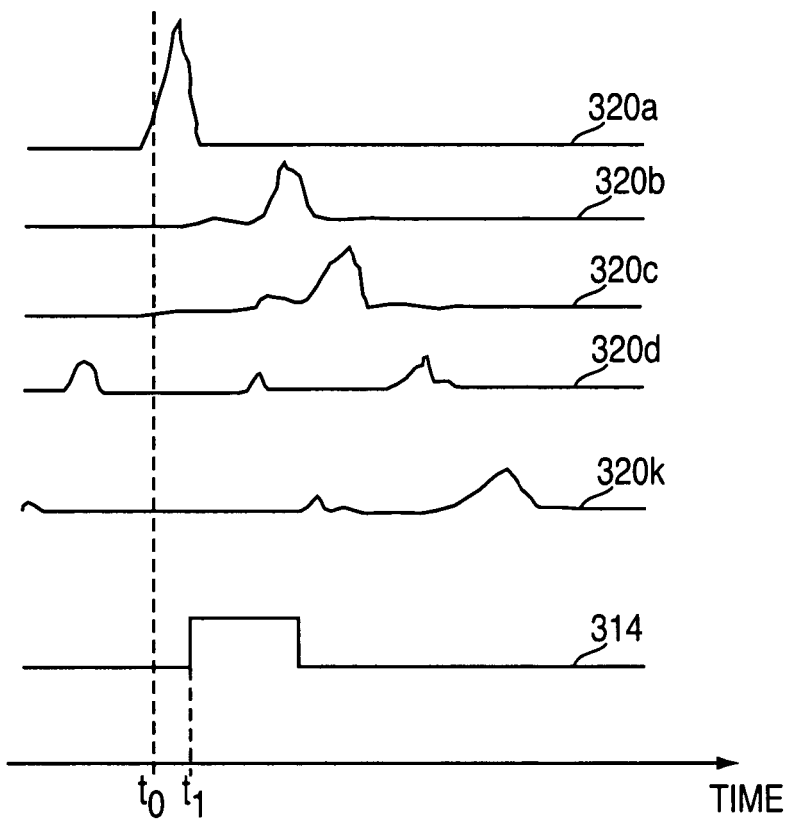
FIG. 5 is a plot of several illustrative circuit traces that are useful in explaining certain aspects of the invention.

FIG. 5 shows an example of some noise signal waveforms that processor 202 may receive via leads 320. Each of these waveforms is identified by the same reference number as the lead 320 on which that waveform is received by processor 202. The presence of noise from a source associated with any one of signals 320 is indicated by that signal having a higher level than otherwise. The greater the noise from a given source, the higher the concurrent (or at least substantially concurrent) level of the associated noise signal 320. Thus an elevated level in any one of noise signals 320 in FIG. 5 constitutes a noise indication in that signal.

FIG. 5 also shows an example of an error signal waveform that display circuitry 212 may output via lead 314. Again, this error signal waveform is identified by the same reference number (314) as the lead on which that waveform is received by processor 202. A relatively low level of signal 314 indicates no error output indication from display circuitry 212. A high level of signal 314 indicates that display circuitry 212 has concurrently (or at least substantially concurrently) detected an error. All of signals 320 and 314 are plotted against the same horizontal time base in FIG. 5 (earlier time to the left; later time to the right).

In the particular example shown in FIG. 5, it will be noted that signal 314 begins (at time t1) to indicate an error in display circuitry 212 shortly after signal 320a begins (at about time t0) to indicate a significant amount of noise from the source associated with signal 320a. Processor 202 detects this timing correlation between the noise burst in signal 320a and the error indication in signal 314, and processor 202 accordingly outputs (via lead 330) an indication that noise from the source associated with signal 320a may have produced the error indicated at time t1. Others of signals 320b-k in FIG. 5 also indicate noise from their associated sources at various other times, but these other noise indications are not sufficiently closely correlated in time to the t1 error indication to have been likely causes of that error indication. Processor 202 detects this lack of correlation between these other noises and the t1 error indication and can thereby rule out attributing the t1 error indication to these other noise sources. Again, the noise and error correlation is closest for the noise burst in signal 320a, and so processor 202 identifies (via lead 330) that noise from the source associated with signal 320a may have caused the error at t1.

Figure 6:
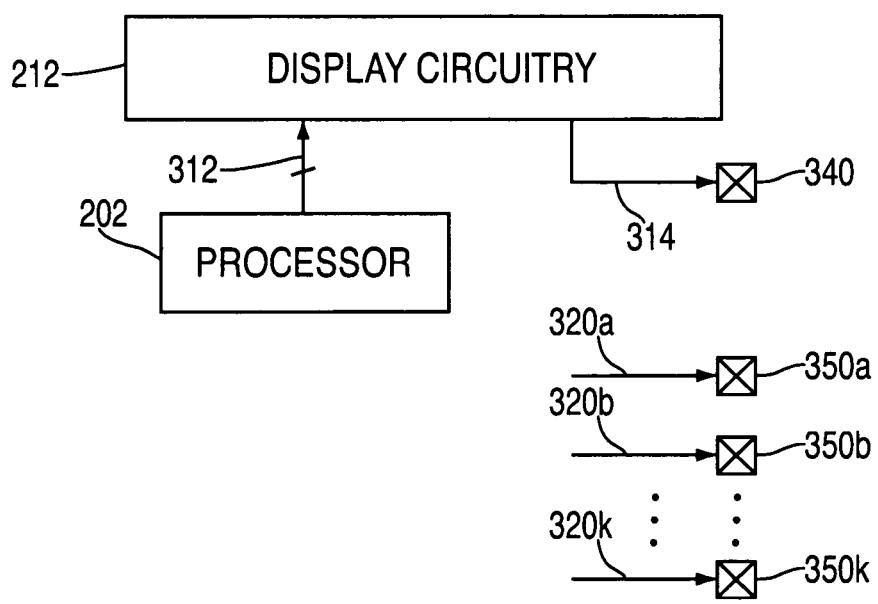
FIG. 6 is a simplified schematic block diagram of an alternative embodiment of circuitry in accordance with the invention.

FIG. 6 shows an embodiment that can be an alternative to the embodiment shown in FIG. 5. In the FIG. 6 embodiment, error signal lead 314 is connected to an output pin 340 that is accessible when device 100 is being operated. Similarly, in the FIG. 6 embodiment, noise signals 320a-k are connected to output pins 350a-k that are accessible when device 100 is being operated. Accessing output pins 340 and 350 may require removal of a portion of the cover of device 100. But it is preferable that at least many (if not all) functions of device 100 are operable while output pins 340 and 350 are accessible.

Figure 7:
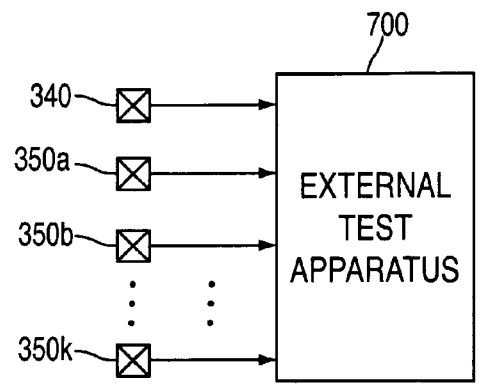
FIG. 7 is a simplified block diagram of an illustrative embodiment of further apparatus in accordance with the invention.

Because output pins 340 and 350 are accessible as described above, they may be connected to external test apparatus 700 as shown, for example, in FIG. 7. These connections of pins 340 and 350 to apparatus 700 are typically only temporary. They are provided and used only when it is desired to test device 100 in accordance with this invention. The same is true for test apparatus 700 itself, i.e., it is provided and used only when it is desired to test device 100.

Apparatus 700 may be any type of circuitry that is capable of detecting correlations between the occurrence of noise in any of signals 320a-k (applied to pins 350a-k as shown in FIG. 6) and an error indication in signal 314 (applied to pin 340 as shown in FIG. 6). For example, apparatus 700 may be an oscilloscope that is capable of displaying several waveforms along the same time base (analogous to what is shown in FIG. 5). Such an oscilloscope display can be used by an observer to determine which noise source in device 100 has produced noise that is most closely correlated (in time) with an error indication. Another example of apparatus that may be used for component 700 is a digital computer with an analog-to-digital interface between each of pins 350a-k and a respective digital input to the computer. The computer may be programmed to identify which of signals 320a-k contains noise of sufficient amplitude and sufficient closeness in time prior to an error indication to have been a possible cause of the indicated error. The computer may be further programmed to output data reporting the results of its determinations (as in the preceding sentence) for each error indication that it receives. For example, computer 700 may output this data on a display or monitor of the computer, or computer 700 may produce a print-out of this data.

The receiver (e.g., a human test engineer or technician) may use the information output by processor 314 at 330 or the information output by apparatus 700 to attempt to correct the condition causing the noise that has been identified as a possible source of one or more error indications. This effort is, of course, greatly aided by the information (determined as described in the preceding paragraphs) as to which of the several possible sources of noise in device 100 is the probable cause of the error indication(s). The test engineer or technician is thereby enabled to concentrate his or her efforts on fixing or improving the performance of that particular portion of device 100.

Figure 8:
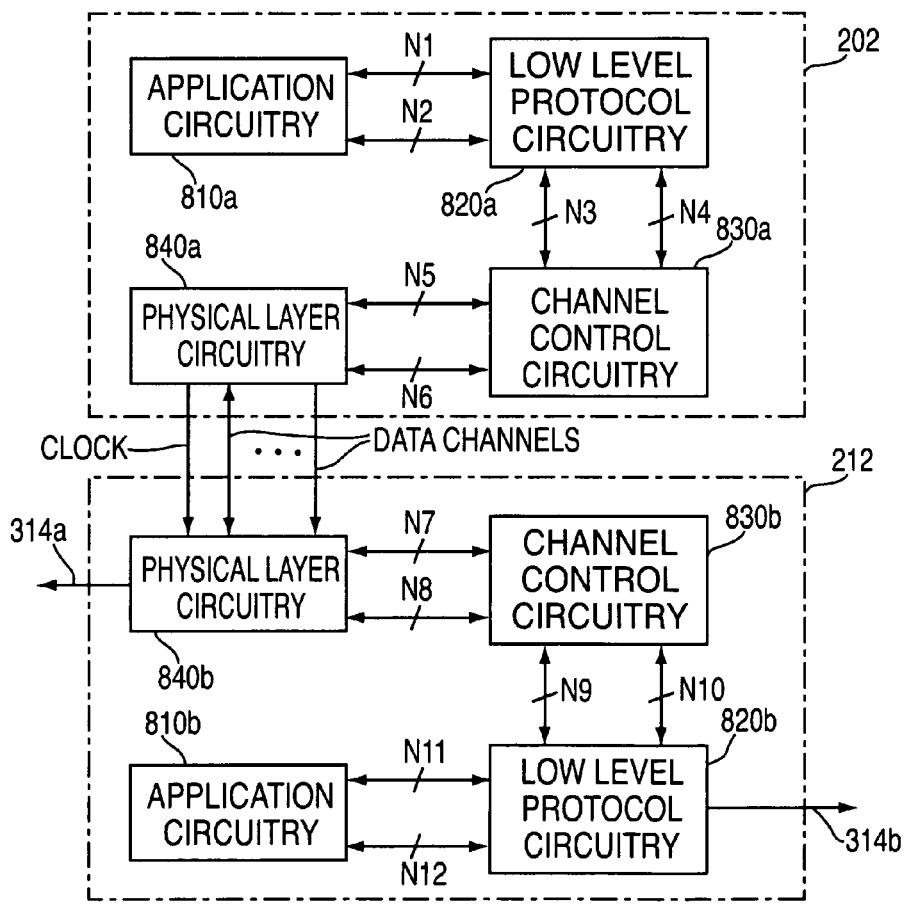
FIG. 8 is a simplified block diagram of an illustrative embodiment of further circuitry in accordance with the invention.

FIG. 8 shows an illustrative embodiment of implementation of certain aspects of the invention in a system (in device 100) that uses a typical protocol (which can be an industry-standard protocol or a non-industry-standard protocol) for communicating data between components. Again, although the communication circuitry shown in FIG. 8 could instead be used for communicating between two other components in device 100, FIG. 8 continues the previously begun example of communication between processor circuitry 202 and display circuitry 212. Thus in FIG. 8, the circuit elements within chain dotted line 202 are typical data communication elements in processor circuitry 202, while the circuit elements within chain dotted line 212 are typical data communication elements in display circuitry 212 (with some added aspects in accordance with this invention). The vertical connections near the middle of FIG. 8 are clock and data connections between components 202 and 212. Each data channel conductor can convey one serial data signal. There can be any number of such data channels.

As is typical for this type of protocol, physical layer circuitry 840 (i.e., 840a in processor 202 and 840b in display circuitry 212) is the lowest level of the data handling circuitry shown in FIG. 8. Some of the functions of the physical layer circuitry 840a and/or 840b may include serializing and deserializing data signals, looking for start of packet and end of packet data, management of certain clock-related functions (e.g., double data rate operations), and providing an appropriate electrical interface between (1) the clock and data channels and (2) the transmitting and/or receiving circuitry. Note that some of the data channels may be bidirectional and others of the data channels may be unidirectional.

The next higher level (layer) of the data handling circuitry shown in FIG. 8 is channel control circuitry 830 (i.e., 830a in processor 202 and 830b in display circuitry 212). Some of the functions of channel control circuitry 830a and/or 830b may include distributing data among various channels and/or combining data from various channels. (As a general matter, throughout FIG. 8 the leads labelled N1, N3, N5, N7, N9, and N11 are parallel data connections between the elements connected by those leads, while the leads labelled N2, N4, N6, N8, N10, and N12 are parallel control connections between the elements connected by those leads. In addition to being an identifier (like a reference number), each parameter N1, N2, N3, etc., may also indicate the number of leads in the associated group of parallel connections. Thus, for example, parameter N1 may indicate any plural number of parallel connections (e.g., eight connections). Although unique identifiers N1, N2, N3, etc., are used for each group of parallel connections, this does not necessarily mean that each of these parameters has a different value. For example, all of parameters N1, N3, N5, N7, N9, and N11 may have the same value such as eight.)

The next higher level (layer) of the data handling circuitry shown in FIG. 8 is low level protocol circuitry 820 (i.e., 820a in processor 202 and 820b in display circuitry 212). Some of the functions of circuitry 820a and/or 820b may include error correction code generation and/or testing, checksum generation and/or testing, providing packet-based control, and the like.

The highest level (layer) of the data handling circuitry shown in FIG. 8 is application circuitry 810 (e.g., 810a in processor 202 and 810b in display circuitry 212). Some of the functions of circuitry 810a and/or 810b may include control command generation, control command interpretation, pixel to byte packing, byte to pixel unpacking, etc.

In accordance with the present invention, output lead 314a may be added to the physical layer 840b that is part of display circuitry 212. Similarly, in accordance with the present invention, output lead 314b may be added to the low level protocol circuitry 820b that is part of display circuitry 212. Either or both of leads 314a and 314b may correspond to the lead 314 described in earlier paragraphs. Thus lead 314a may carry a signal (also referred to by reference 314a) that indicates when at least certain kinds of errors are detected by physical layer circuitry 840b. Similarly, lead 314b may carry a signal (also referred to by reference 314b) that indicates when at least certain kinds of errors are detected by low level protocol circuitry 820b. Examples of the kinds of errors that may cause physical layer circuitry 840b to output an error indication via error signal 314a are a defective or incomplete start-of-packet byte, a defective or incomplete end-of-packet byte, etc. Examples of the kinds of errors that may cause low level protocol circuitry 820b to output an error indication via error signal 314b are a checksum error, an error correction code ("ECC") error, etc. Each of components 840b and 820b preferably outputs an error indication in its respective error signal 314a or 314b as soon as possible after an error is detected. This is desirable to better reveal correlation (as described earlier in this specification) between an error indication and noise from a possible noise source.

It will be appreciated that speedy output of error indications (e.g., in signals 314a and/or 314b) is greatly facilitated by using relatively low level circuitry (e.g., physical layer circuitry 840b and/or low level protocol circuitry 820b) to provide such error indications. Error indications from these relatively low level circuitries tend to occur earlier than error indications from higher level circuitry such as application circuitry 810b. In accordance with this invention, error indications from relatively low level sources (like 840b and/or 820b) better preserve the close time correlation between a noise event and a resulting data error. Such close time correlation enables more reliable identification of the noise that was the probable cause of a data error, and such more reliable noise source identification gives a test engineer or technician better information for use in ameliorating a noise problem that is causing data errors.

Examples of measures that an engineer or technician may take to remedy an error-causing noise problem are strengthening connections that may be the cause of the problem, strengthening or improving the performance of a power supply, replacing a component to reduce noise, redesigning a component to reduce noise, etc.

It will be understood that the foregoing is only illustrative of the principle of the invention, and that various modifications can be made by those skilled in the art without departing from the scope and spirit of the invention. For example, the principles discussed above are generally usable regardless of the data communication protocol employed. In particular, relatively low level circuitry involved in the data communication (especially the reception of data signals) is preferably used to generate data error indications like 314, 314a, 314b because error indications from such low level circuitry can be provided earlier than from higher level circuitry and are therefore better correlated in time with a noise event that may have caused the data error.

The invention claimed is:

1. An electronic device comprising:
   a component configured to receive a data signal and process data from the signal through a series of circuit layers, beginning with a first circuit layer configured to initially receive the data signal, and ending with a second circuit layer configured to perform an application on data from the data signal, one of the series of circuit layers outputting from the component an error signal containing an error indication, the error signal being generated substantially concurrent with detection, by the one of the series of circuit layers, of a data error occurring in the data signal;
   a lead configured to convey a noise signal containing noise indications substantially concurrent with noise produced by a noise source of the electronic device; and
   processor circuitry configured to receive the error signal and the noise signal, and configured to compare timing of the error indication in the error signal and the noise indications in the noise signal, wherein the processor circuitry is configured to produce an output signal identifying the noise source as a possible cause of the error indication if the error indication has a predetermined timing relationship to the noise indication, and wherein the predetermined timing relationship requires the noise indication to be no more than a predetermined amount of time prior to the error indication.

2. The electronic device defined in claim 1 further comprising:
   a first device output terminal to which the error signal is applied; and
   a second device output terminal to which the lead is connected.

3. Apparatus comprising the electronic device defined in claim 2 and the circuitry external to the electronic device for receiving the error signal from the first device output terminal and the noise signal from the second device output terminal.

4. The apparatus defined in claim 3 wherein the circuitry external to the electronic device is adapted to compare timing of an error indication in the error signal and a noise indication in the noise signal.

5. The apparatus defined in claim 3 wherein the circuitry external to the electronic device is adapted to compare timing of an error indication in the error signal and a noise indication in the noise signal.

6. The electronic device defined in claim 1 further comprising:
a plurality of leads, each conveying a respective one of a plurality of noise signals, each of the noise signals containing noise indication substantially concurrent with noise produced by a respective one of a plurality of noise sources.

7. The electronic device defined in claim 6 further comprising:
processor circuitry for receiving the error signal and the noise signals, and for comparing timing of an error indication in the error signal and the noise indications in the noise signals.

8. The electronic device defined in claim 7 wherein the processor circuitry produces an output signal identifying, as a possible cause of the error indication, a one of the noise sources for which the noise signal contained a noise indication having a predetermined timing relationship to the error indication.

9. The electronic device defined in claim 8 wherein the predetermined relationship requires the noise indication to be no more than a predetermined amount of time prior to the error indication.

10. The electronic device defined in claim 6 further comprising:
a first device output terminal to which the error signal is applied; and
a plurality of second device output terminals to which the leads are respectively connected.

11. Apparatus comprising the electronic device defined in claim 10 and circuitry external to the electronic device for receiving the error signal from the first device output terminal and the plurality of noise signals from the plurality of second device output terminals.

12. The apparatus defined in claim 11 wherein the circuitry external to the electronic device is adapted to display the error signal and the plurality of noise signals plotted against a common time base.

13. The apparatus defined in claim 11 wherein the apparatus external to the electronic device is adapted to compare timing of an error indication in the error signal and the noise indications in the plurality of noise signals.

14. The electronic device defined in claim 1 wherein the first circuit layer comprises physical layer circuitry.

15. The electronic device defined in claim 14 wherein the circuit layers comprises an intermediate level circuit layer that is intermediate to the first circuit layer and the second circuit layer, and wherein the intermediate level circuit layer outputs from the component a second error signal containing an error indication substantially concurrent with the intermediate level circuit layer detecting a data error in the data signal.

16. The electronic device defined in claim 15 further comprising:
a lead configured to convey a noise signal containing noise indications substantially concurrent with noise produced by a noise source of the electronic device; and
processor circuitry configured to receive the error signal, the second error signal, and the noise signal, and configured to compare timing of the error indication in either of the error signal or the second error signal and the noise indication in the noise signal.

17. The electronic device defined in claim 1 wherein the component comprises a display of the electronic device.

18. A method of testing an electronic device including a component configured to receive a data signal and process data from that data signal through a series of circuit layers, beginning with a first circuit layer configured to initially receive the data signal, and ending with a second circuit layer configured to perform an application on the data from the data signal, the method comprising:
causing one of the series of circuit layers to output from the component an error signal containing an error indication, the error signal being generated substantially concurrent with detection, by the one of the series of circuit layers, of a data error occurring in the data signal; and
comparing timing of the error indication in the error signal and a noise indication in a noise signal, the noise signal containing noise indications substantially concurrent with noise produced by a noise source of the electronic device, wherein comparing the timing of the error indication in the error signal and the noise indication in the noise signal comprises determining whether the noise indication is within a predetermined time interval prior to the error indication.

19. The method defined in claim 18 wherein the comparing comprises:
further comparing timing of the error indication in the error signal and the noise indications in each of a plurality of noise signals, each of the plurality of noise signals containing noise indications substantially concurrent with noise produced by a respective one of a plurality of noise sources of the electronic device.

20. The method defined in claim 19 wherein the further comparing comprises:
determining whether the noise indication in any of the noise signals is within a predetermined time interval prior to the error indication, and if so, identifying the noise source for that noise signal as a possible cause of the error indication.

21. The method defined in claim 18 wherein the causing comprises outputting the error signal from physical layer circuitry of the component.

* * * * *